(12) United States Patent
Shahvandi et al.

(10) Patent No.: US 6,217,660 B1
(45) Date of Patent: Apr. 17, 2001

(54) METHOD FOR CLEANING A THROTTLE VALVE AND APPARATUS

(75) Inventors: Iraj Shahvandi, Dresden (DE); Leroy Grant, Austin, TX (US); Oliver Vatel, Dresden (DE)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/541,645

(22) Filed: Apr. 3, 2000

(51) Int. Cl.[7] .................................................. C23C 16/00
(52) U.S. Cl. ............................................ 118/715; 137/242
(58) Field of Search ............................. 118/715; 137/242

(56) References Cited

U.S. PATENT DOCUMENTS 4,653,525 * 3/1987 Young ................................... 137/238
5,707,451 * 1/1998 Robles ................................. 118/715

* cited by examiner

Primary Examiner—Richard Bueker

(57) ABSTRACT

An improved method of cleaning a throttle valve and an apparatus for facilitating such cleaning.

The method of cleaning a throttle valve is provided by applying ultrasonic wave to the throttle valve. The throttle valve is juxtaposed in close proximity to the exhaust gas port of the reaction chamber. A cleaning gas of nitrogen is used to clean the throttle valve. The throttle valve is heated by an imbedded control heater.

8 Claims, 1 Drawing Sheet

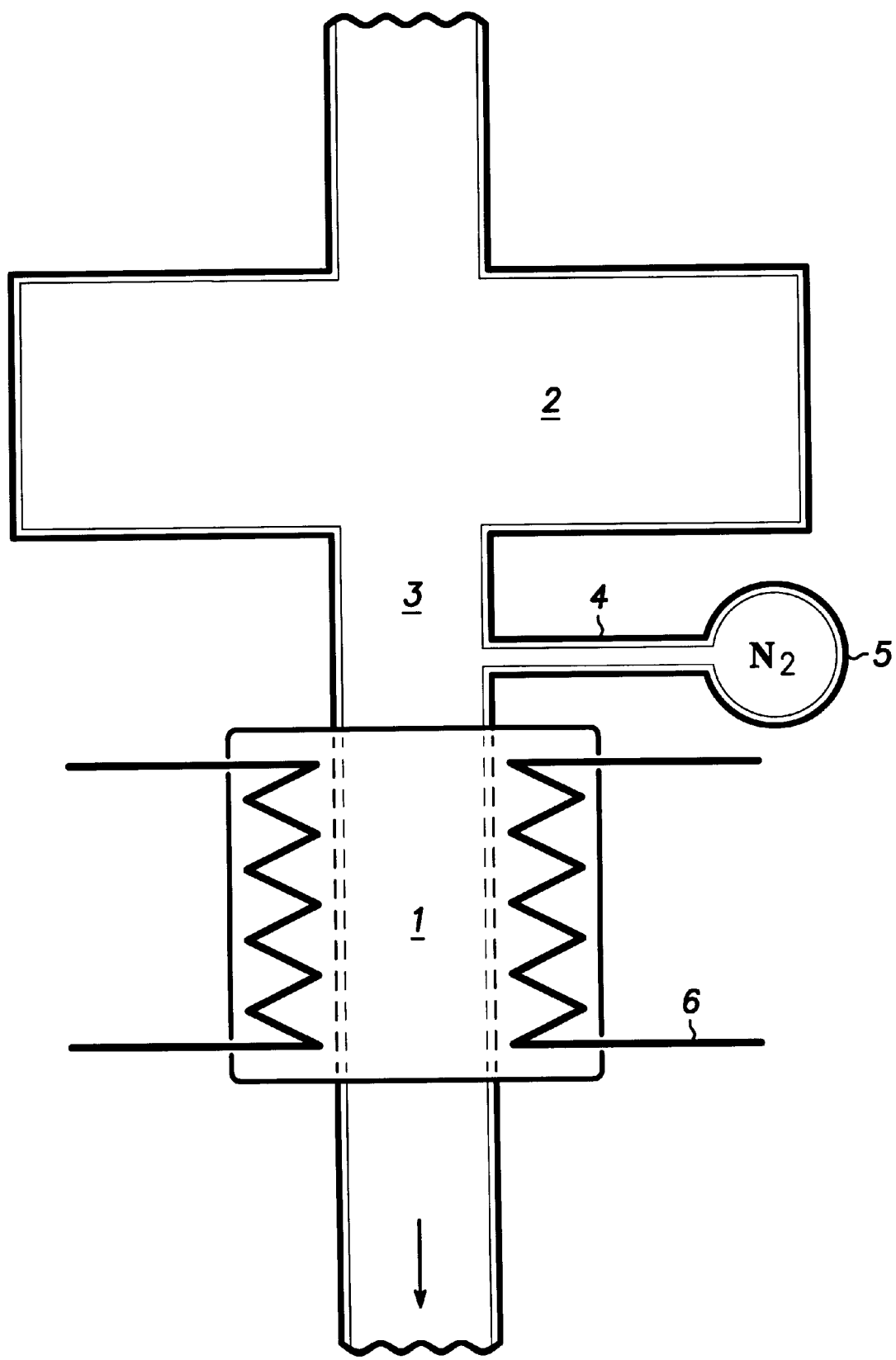

METHOD FOR CLEANING A THROTTLE VALVE AND APPARATUS

FIELD OF THE INVENTION

The present invention generally relates to an improved method of cleaning a throttle valve and more particularly, relates to an improved method of cleaning a valve attached in close proximity to a vacuum deposition chamber. The present invention is further directed to an apparatus which includes a throttle valve which is mounted immediately adjacent to the exhaust gas port of the vacuum deposition chamber.

BACKGROUND OF THE INVENTION

Chemical vapor deposition (hereinafter CVD) methods are used broadly in the manufacture of semiconductor wafers. CVD involves exposing a semiconductor wafer to a reactive gas under carefully controlled conditions of elevated temperatures, sub-ambient pressures, and uniform reactant gas flow rate so that a thin, uniform layer of film is deposited on the surface of the substrate. There are several types of CVD processes, such as, for example, atmospheric CVD, low-pressure CVD, reduced-pressure CVD and plasma enhanced CVD.

A commonly used CVD system is a single-wafer CVD system utilizing a high-throughput CVD chamber. This is a result of the more stringent standards of film quality and increasing wafer sizes utilized in recent years.

For processing, typically, a CVD chamber is first heated to about 300.degree. C. to abut 1,000.degree. C. A semiconductor substrate is mounted on a holding piece, called a susceptor, which is typically made of anodized aluminum. Then, processing gases are flowed into the chamber while the chamber pressure is regulated to an optimum level for achieving a uniform layer of film. The gases react to form a deposition layer on the surface of the wafer.

Since chamber pressure is an important processing parameter, means must be provided to accurately control such chamber pressure. The chamber pressure is controlled by regulating the flow rates of the gases and by an inlet flow regulating device, and by an exhaust flow control apparatus attached to the exhaust gas port of the vacuum deposition chamber. The exhaust flow control apparatus consists of a shut-off valve, a throttle valve and a vacuum pump with the shut-off valve typically connected directly to the exhaust gas port of the reaction chamber. During a standard deposition process, the shut-off valve remains open while the throttle valve opens and closes repeatedly to regulate the gas pressure in the chamber. The throttle valve is controlled by a servo-motor which is in turn controlled by a close-loop control system based on the feed-back signals from a pressure manometer mounted in the reaction chamber.

In a conventional deposition process, reactant gases enter the reaction chamber and produce films of various materials on the surface of a substrate for various purposes such as for dielectric layers, for insulation layers, etc. The various electronic materials deposited include epitaxial silicon, polysilicon, silicon nitride, silicon oxide, refractory metals such as titanium, tungsten and their silicides. In these film deposition processes, most of the material from the reactant gases is deposited on the substrate surface. However, it is inevitable that material is also deposited on other surfaces inside the chamber and on the throttle valve. This is especially true, in depositions of certain materials such as silicon oxide which requires a relatively high chamber pressure. It has been observed that the higher the deposition pressure required for a certain material, the more unwanted film is deposited inside the throttle valve.

In order to ensure the reproducibility of high quality wafer production, the reactant gas pressure inside the reaction chamber must be precisely controlled. This in turn requires the precise operation of the throttle valve in the exhaust flow control system. In a prior art CVD system, the exhaust flow control system consists of a shut-off valve installed immediately adjacent to the reaction chamber exhaust gas port, a throttle valve installed downstream from the shut-off valve at a distance of approximately 6–10 inches away from the reaction chamber exhaust port, and a vacuum pump installed downstream from and in fluid communication with the throttle valve and the shut-off valve. In this arrangement, semiconductor materials that are deposited at high chamber pressures, i.e., higher than 400 Torr, tend to deposit on the throttle valve after a certain number of deposition cycles.

In the normal operation of a CVD system, after each vacuum deposition process of coating a semiconductor substrate, a cleaning gas or a mixture of cleaning gases is purged through the reaction chamber in order to clean the chamber interior which includes the chamber walls and the susceptor. One such cleaning gas system is a mixture of nitrogen trifluoride, hexafluoroethane and oxygen for cleaning unwanted silicon oxide films from the chamber interior. Even though a plasma gas is ignited in the chamber to enhance its cleaning efficiency, the reactive species of the cleaning gas cannot reach the throttle valve for effective cleaning due to their limited lifetime. As a consequence, after several deposition processes are conducted in the reaction chamber, i.e., between 500 to 1,000 cycles, a sufficient amount of unwanted silicon oxide film is deposited and remains on the throttle valve to render it unfunctional, that is, the deposited material increases the diameter of the valve causing the throttle valve to scrape against the valve chamber as the throttle opens and closes. The scraping action prevents a smooth motion of the throttle valve; instead, the throttle valve functions sluggishly and is no longer capable of providing accurate pressure control in the reaction chamber. This basically inoperable throttle valve leads to poor pressure control in the reaction chamber and thereby contributes to the production of silicon wafers having poor repeatability and reliability.

Periodically, after approximately 500 to 1,000 deposition cycles, therefore, the throttle valve assembly must be completely disassembled and manually cleaned by a wet chemistry technique. This is a very laborious and time consuming process which leads to poor throughput and increased cost of manufacturing. Furthermore, after each manual cleaning process, the entire exhaust flow control system must be recalibrated in order to resume the production of silicon wafers in the reaction chamber.

It is therefore an object of the present invention to provide an in-situ cleaning method for the throttle valve especially used in a vacuum deposition device that does not have the shortcomings of the prior art methods.

It is another object of the present invention to provide an improved in-situ cleaning method of a throttle valve without extensive equipment modifications.

It is yet another object of the present invention to provide a system that includes a throttle valve for regulating the gas pressure in a chamber which can be cleaned in-situ.

BRIEF DESCRIPTION OF THE DRAWING

Other objects, features and advantages of the present invention will become apparent upon consideration of the specification and the appended drawing, in which:

FIG. 1 is a cross section view of a vacuum deposition chamber and a throttle valve of the present invention.

DETAILED DESCRIPTION OF THE PREFERRED EMBODIMENTS

The present invention provides an improved method of in-situ cleaning a throttle valve attached to a vacuum deposition chamber during the operational state.

Referring to FIG. 1, a cross section view of a throttle valve 1 attached to a vacuum deposition chamber 2 is shown. A CVD vacuum deposition chamber 2 for processing semiconductor substrates has an outlet pipe 3. Throttle valve 1 is connected to the outlet pipe 3. The throttle valve 1 is controlled by a precision servo-motor (not shown). An inlet pipe 4 is connected to the outlet pipe 3 of the vacuum chamber. Further a nitrogen source 5 is connected to the inlet pipe 4. As a result, the gas exhausted from the vacuum deposition chamber 2 and the nitrogen gas exhausted from the nitrogen source 5 pass through the throttle valve due to a pump (not shown).

It is noticed that the throttle valve 1 is mounted downstream from the vacuum chamber. As a consequence, the nitrogen gas of the source 5 cannot pass the vacuum chamber 2.

Coils 6 are placed around the throttle valve 1. The coils 6 are connected to a power supply (not shown). The throttle valve 1 will be heated by the coils 6.

An ultrasound generator (not shown) is mounted adjacent to the throttle valve. Ultrasound will be applied to the throttle valve in order to clean the throttle valve.

The design does not influence the process in the vacuum chamber. For this reason, a redesign can be avoided.

The improved cleaning method of the present invention provides a unique arrangement of the throttle valve close to the vacuum deposition chamber such that the valve can be cleaned during a deposition of silicon oxide films of silicon oxide films within the vacuum chamber. This effective cleaning procedure prevents the throttle valve from malfunctioning, which in turn provides for more consistent processing from wafer to wafer.

It should be noted that even though the deposition of silicon oxide films is used as an example in the preferred embodiment, the present improved cleaning method for the throttle valve can be used in the deposition process of any film materials when the cleaning of such throttle valve is desired.

It should also be noted that even though the cleaning gas of nitrogen is illustrated in the preferred embodiment, any other cleaning gas which will react with and etch away deposited material from the deposition process may also be suitably used to provide the same desirable results.

In accordance with the present invention, an improved method of cleaning a throttle valve and an improved apparatus are provided.

In accordance with the present invention the throttle valve is cleaned by ultrasound during the operation. It is then prevented that particles in the valve stick.

The valve advantageously is heated during the operation. Therefore, the valve is cleaned in a better way.

In an embodiment, nitrogen is introduced into the valve in order to clean it. Due to the nitrogen the cleaning of the throttle valve is improved.

If the valve is connected to a chamber, then the valve is attached particularly at the outlet of the chamber. Nitrogen then doesn't penetrate into the chamber. As a result, processes in the chamber aren't disrupted by the nitrogen.

In a further embodiment of the invention, an apparatus includes a throttle valve and an ultrasound source. The valve is connected to the ultrasound source so that the mobile parts of the valve are exposed to the ultrasound. It is prevented by the ultrasound that particles can collect in the valve. As a result, troubles due to the particles are avoided. In comparison with the state of the art there is a longer operating time.

In a further embodiment of the invention, the apparatus further comprises a heater in order to heat the valve during operation. The heater is attached at the throttle valve. A deposition of particles on the throttle valve is hardly possible. As a result, troubles are reduced.

In a further embodiment of the invention, the heater is formed by coils, which are connected to an electric power supply. If an electric current flows through the coils, then the adjacent valve is heated up.

In a further embodiment of the invention, there is a connection between the throttle valve and a vacuum chamber or a reaction chamber. This leads to good pressure control in the chamber. For example thereby the embodiment of the invention contributes to the production of silicon wafers having good repeatability and reliability.

In a further embodiment of the invention, there is a nitrogen supply and an inlet pipe between the nitrogen supply and the throttle valve. If nitrogen is penetrating into the valve, no particles can remain in the valve. This is a more improved way in order to avoid troubles.

Due to the invention, cleaning of the throttle valve during operation is possible. A pressure in the adjacent chamber can be controlled very exactly. Maintenance work can be reduced.

In the preferred embodiment, the improved method of cleaning a throttle valve is provided by applying ultrasonic wave to the throttle valve. The throttle valve is juxtaposed in close proximity to the exhaust gas port of the reaction chamber. A cleaning gas of nitrogen is used to clean the throttle valve. The throttle valve is heated by an imbedded control heater.

The present invention is further directed to an apparatus used in a vacuum deposition chamber for controlling the flow passage and regulating gas pressure in a vacuum deposition chamber. The exhaust flow control apparatus consists of a throttle valve mounted immediately adjacent to the exhaust gas port of the vacuum chamber, an ultrasonic generator for applying an ultrasonic wave to the throttle valve, a heater in order to heat the throttle valve, an inlet pipe in order to introduce nitrogen into the throttle valve and a pump mounted downstream from the throttle valve for evacuating gas from the vacuum deposition chamber.

The ultrasonic wave produces ultrasonic frequency vibrations agitating the throttle valve moving part.

The improvements are: process pressure stabilization in the vacuum chamber, less equipment down time, particle reduction, less maintenance issues, manufacturable design, improved reliability. The design does not influence the existing process. Therefore no process change is required.

While the present invention has been described in an illustrative manner, it should be understood that the terminology used is intended to in a nature of words of description rather than of limitation.

Furthermore, while the present invention has been described in terms of a preferred embodiment thereof, it is to be appreciated that those skilled in the art will readily apply these teachings to other possible variations of the invention.

What is clamed is:

1. An exhaust flow control apparatus for controlling a flow passage and regulating gas pressure comprising
   a throttle valve for regulating a gas flow and
   an ultrasound source for applying ultrasound to said throttle valve.

2. An apparatus according to claim 1, wherein said apparatus further includes heating means for heating said throttle valve.

3. An apparatus according to claim 2, wherein said heating means are composed of coils which are attached at said throttle valve.

4. An apparatus according to claim 1, wherein said apparatus further includes an inlet pipe and a nitrogen gas supply for feeding said gas into the throttle valve.

5. A chemical vapor deposition device for depositing films on substrates comprising:
   a vacuum chamber for conducting said film deposition process,
   an exhaust gas port of said vacuum chamber,
   a throttle valve mounted adjacent to said exhaust gas port,
   an ultrasound generator for applying ultrasound to the throttle valve.

6. A device according to claim 5, wherein said device further includes heating means for heating the said throttle valve.

7. A device according to claim 6, wherein said heating means are composed of coils which are attached at said throttle valve.

8. A device according to claim 5, wherein said apparatus further includes an inlet pipe and a nitrogen gas supply for feeding said gas into the throttle valve.

* * * * *